(12) United States Patent
Tadauchi et al.

(10) Patent No.: US 6,673,310 B2
(45) Date of Patent: Jan. 6, 2004

(54) SOLDER MATERIAL, DEVICE USING THE SAME AND MANUFACTURING PROCESS THEREOF

(75) Inventors: Masahiro Tadauchi, Tokyo (JP); Izuru Komatsu, Kanagawa (JP); Hiroshi Tateishi, Kanagawa (JP); Kouichi Teshima, Tokyo (JP); Kazutaka Matsumoto, Kanagawa (JP); Tetsuji Hori, Kanagawa (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/749,606

(22) Filed: Dec. 28, 2000

(65) Prior Publication Data

US 2001/0029095 A1 Oct. 11, 2001

(30) Foreign Application Priority Data

Dec. 28, 1999 (JP) .......................... P11-373404

(51) Int. Cl.$^7$ .............................. C22C 13/00
(52) U.S. Cl. ....................... 420/557; 420/524
(58) Field of Search .................. 420/557, 524

(56) References Cited

U.S. PATENT DOCUMENTS

| 4,112,868 | A | * | 9/1978 | Nomaki et al. | ............. | 118/429 |
| 5,698,160 | A | * | 12/1997 | Chen et al. | ................. | 420/557 |
| 5,835,350 | A | * | 11/1998 | Stevens | ..................... | 361/704 |
| 6,187,114 | B1 | * | 2/2001 | Ogashiwa et al. | .......... | 148/400 |

* cited by examiner

*Primary Examiner*—Roy King
*Assistant Examiner*—Andrew Wessman
(74) *Attorney, Agent, or Firm*—Foley & Lardner

(57) ABSTRACT

Disclosed is a high-temperature solder material which is composed of tin, zinc and silver, or of 0.01 to 2 wt % germanium or aluminum and the balance tin, or tin and zinc at a ratio of 80/20 to 70/30. The tin/zinc/silver solder has a composition ratio that the ratio of till to zinc is within a range of 97/3 to 79/21 by weight, and the ratio of the sum of tin and zinc to silver is within a range of 88/12 to 50/50 by weight, or that the ratio of tin to zinc is within a range of 70/30 to 5/95 by weight, and the ratio of silver to the sum of tin, zinc and silver is 15% by weight or less. The solder material is used for producing electric or electronic devices and equipments.

11 Claims, 3 Drawing Sheets

SOLDER MATERIAL, DEVICE USING THE SAME AND MANUFACTURING PROCESS THEREOF

BACKGROUND OF THE INVENTION

1. Field of the Invention

The present invention relates to a solder material containing no lead for soldering electric, electronic or mechanical components, and a device in which the solder material is used for bonding, and a manufacturing process for the device or apparatus using the solder material. More particularly, the invention relates to a tin-based solder material being suitable for a high-temperature solder which is used as a bonding material for manufacturing products which is significantly durable under increased temperature conditions, a device or apparatus produced using that solder material fur assembling, and a manufacturing process for that device using the solder material.

2. Related Art

In the current industries, soldering is widely used for bonding and assembling of various derives and apparatuses including electronic components and the like. For example, surface mounting process involves solder bonding for mounting electronic components including semiconductors, microprocessors, memories, resistors and the like on a printed circuit board.

The conventional solder materials which have been popularly used are of the eutectic tin/lead alloy type which is mainly composed of tin and lead. The theoretical eutectic point of tin/lead alloy is 183° C., which is lower than the temperature where most of thermoset resins start turning to a gaseous form. Accordingly, such tin/lead eutectic solder materials have an advantage that their increased temperature for bonding the components may hardly give damage to printed circuit boards and the like on when the soldering is carried out. It is hence known in the electronic industries that tin/lead eutectic solders are primary materials for assembling and soldering the components to produce an electronic device, On the other hand, high-temperature solder materials such as Pb-5%Sn are favorably used for manufacturing a semiconductor device, e.g. a power transistor, which is commonly loaded with high voltage and current and possibly generates a considerable amount of heat so that they offer higher resistance to heat at the joints.

However, the issue of environmental protection from industrial wastes has been under consideration for recent years. The conventional solder materials equally provide a drawback that lead contained in the electronic devices may be eluted as lead ions and accumulated in the ground. In order to solve the above problems, improved soldering techniques with the use of soldering materials which contain no lead is needed.

However, newly proposed soldering materials where lead is replaced by one or more metals fail to exhibit satisfactory levels of the soldering characteristics, such as wetting property, soldering temperature, physical strength and cost effectiveness. Therefore, they can hardly be used for general products throughout the relevant industries, but may only be admitted for use in specific applications.

The inventors of the present application have proposed the use of a tin/zinc solder under particular controlled conditions, which consists mainly of generally available metals but contains no lead thus eliminating the above drawback of environmental pollution (See Japanese Patent Application Laid-open No. 8-243782). Since the tin/zinc eutectic composition is low in the melting point, it can favorably be used as a low-temperature solder material equivalent to the conventional tin/lead solders provided that the wetting property attributed to the tin/Zinc solder is exhibited. This may indicate the introduction of a qualified low melting-point solder without using lead.

However, the introduction of improved high-temperature solder is not yet feasible.

Proposed in Japanese Patent Application Laid-open No. 1-172352 is a Zn/Al/Mg-based solder which contains no lead and may replace the Pb-5% Sn solder as a conventional high-temperature solder material. However, this material is rather low in the processability and also poor in the wetting property due to the composition of easily oxidizable elements, hence being unfavorable for practical use.

On the other hand, tin/copper-based solders have been attempted for use in practice. However, it has developed that a η phase of intermetallic compound between tin and copper produces, thus deteriorating the joint with copper members and declining its physical strength.

SUMMARY OF THE INVENTION

It is, therefore, an object of the present invention to provide a lead-free high-temperature solder which consists of generally available, less expensive materials and is suited for soldering at a higher range of temperature.

It is another object of the present invention to provide an assembly or a device which is joined and/or assembled by soldering with the lead-free high-temperature solder made of generally available materials, thus having a higher resistance to heat.

The inventors of the present application have conducted a series of studies for developing an improved technique of soldering with a tin/zinc-based solder which contains no lead and consists mainly of generally available materials. As a result, it is proved that the high-temperature solder is implemented by a composition containing tin as the base material with zinc and silver, or a tin-based composition containing germanium or aluminum.

In order to achieve the above-mentioned object, a solder material according to the present invention comprises: tin, zinc and silver, wherein the ratio of tin to zinc is within a range of 97/3 to 79/21 by weight, and the ratio of the sum of tin and zinc to sliver is within a range of 88/12 to 50/50 by weight.

According to another aspect, a solder material of the present invention comprises: tin, zinc and silver, wherein the ratio of tin to zinc is within a range of 70/30 to 5/95 by weight, and the ratio of silver to the sum of tin, zinc and silver is 15% by weight or less.

According to further aspect, a solder material of the present invention consists essentially of 0.01 to 2% by weight of a metal element selected from the group consisting of germanium and aluminum, and the balance tin.

According to further aspect, a high temperature solder material for use in a power device of the present invention comprises tin and zinc, wherein the ratio of tin to zinc is 70/:30 to 80/20.

An electric or electronic device according to the present invention comprises parts which are joined with a solder material, and the solder material comprising either of the above-described solder materials.

A process for manufacturing an electric or electronic device according to the present invention, comprises: soldering with a first solder material at a first temperature; and soldering later than soldering with the first solder material with a second solder material at a second temperature which is lower than the first temperature, wherein the first solder material comprises one of the above-described solder materials.

BRIEF DESCRIPTION OF THE DRAWINGS

The features and advantages of the solder material, the device and apparatus produced with it and the manufacturing process for the device according to the present invention over the proposed arts will be more clearly understood from the following description of the preferred embodiments of the present invention taken in conjunction with the accompanying drawings in which like reference numerals designate the same or similar elements or sections throughout the figures thereof and in which.

DETAILED DESCRIPTION OF THE PREFERRED EMBODIMENTS

Figure 1A:
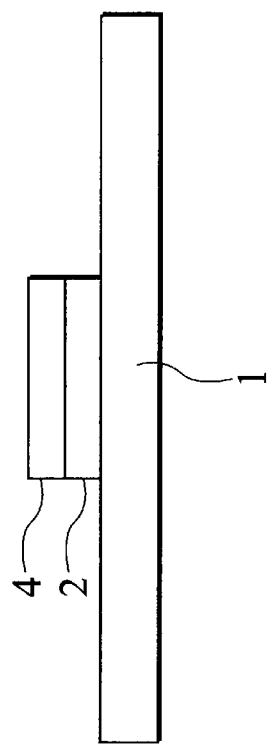
FIGS. 1A and 1B are cross sectional views showing examples of soldering with a solder material of the present invention.

Power semiconductor elements such as a power transistor and the like generate a large amount of heat when they are loaded with a higher voltage or current. As the device or apparatus containing the power semiconductor element is repeatedly switched on and off, its cycle of increasing and decreasing of the temperature may develop a thermal stress due to difference in the linear expansion between the joined materials, resulting in unwanted distortion at the joints. If the temperature increase is severe, the solder joint may be melted down. Such distortion and melting will lead to physical damage or thermal fatigue such as crack or breakage, and hence degrading the performance of the device. Therefore, the effect of thermal fatigue must not be negligible and it is necessary to employ a high-temperature solder that is less susceptible to heat and durable to use accompanied with thermal change, for soldering the joints in such a kind of devices and apparatus. The high-temperature solder is similarly used for electric equipments whose operation is accompanied with thermal elevation.

The inventors has found through a series of studies over miscellaneous metal materials that the high-temperature solder is successfully implemented by an Sn/Zn/Ag material an Sn/Zn material of which the ratio of Sn/Zn is from 80/20 to 30/30, or an Sn/(Ge and/or Al) material. Those will now be described in more detail.

(1) Sn/Zn/Ag Solder Material

Tin/zinc eutectic composition is lower in the melting point than tin or zinc and their surface tension in the melted state is smaller than tin or zinc. Therefore, this allows that eutectic composition to be soldered at a lower temperature and tin/zinc eutectic composition is substantially high in the wetting property. The solder including zinc is declined in the wetting property due to the existence of oxygen. When no oxygen is permitted, the solder will be favorable in the wetting property and high in the physical strength as well. Moreover, tin/zinc alloy is higher in the electrical conductivity and thus smaller in the generation of heat upon energization than tin/lead alloy which includes a conventional solder, hence being advantageous in the energy saving and the thermal resistance at the conductive joints. It is hence desirable to use such tin/zinc alloy as the high-temperature solder applicable in a temperature range from 250 to 400° C. That is realized by incorporating a silver into a composition of tin/zinc alloy.

The tin/zinc compositions provide two types of the silver incorporated tin/zinc compositions for implementing the high-temperature solder.

The first type includes a composition produced by combining a tin/zinc eutectic or quasi-eutectic composition with a predetermined amount of silver. More particularly, the weight ratio between tin and zinc ranges from 97/3 to 79/21 while the weight ratio of a sum of tin and zinc to silver ranges from 88/12 to 50/50. The resultant tin/zinc/silver solder is low in the surface tension at the melted state and then exhibits a favorable level of the wetting property. As its blending with silver raises the liquidus temperature, the solder can favorably be used as the high-temperature solder. In other words, the wetting property attributed to this type of high-temperature solder is significantly exhibited with the tin/zinc composition. Moreover, as the temperature increases, the melted zinc becomes smaller in the surface tension than the molted silver. This allows the tin/zinc/silver composition to be higher in the wetting property at a higher temperature than the tin/silver composition. If the ratio of zinc is out of the above range, the molten solder will be increased in the surface tension and decreased in the wetting property. Accordingly, the weight ratio between tin and zinc is close to that of eutectic composition, namely ranging from 97/3 to 79/21, and preferably from 93/7 to 87/13. When the weight ratio of a sum of tin and zinc to silver is higher than 88/12, i.e. the amount of silver being declined, the solidus temperature drops down, thus inhibiting the composition from being used as the high-temperature solder. When the amount of silver is increased from 50/50, the liquidus temperature rises up, thus making the sufficient melting difficult at its regular soldering temperature.

The second type includes a composition produced by combining zinc-rich tin/zinc composition with a specified amount of silver. More specifically, the weight ratio between tin and zinc ranges from 70/30 to 5/95. The weight ratio of a sum of tin and zinc to silver is within a range of 100/0 to 85/15. The metallographic structure of the zinc-rich tin/zinc/silver composition is densely concentrated by the effect of silver/zinc compound and its solidus temperature is raised due to the amount of zinc, it can favorably be used as the high-temperature solder. When the ratio of tin to zinc is higher than 70/30, i.e. the amount of zinc being decreased, the solidus temperature drops down, thus inhibiting the composition from being used as the high-temperature solder. When the amount of zinc exceeds 5/95. the liquidus temperature rises up, thus making the soldering difficult at the general temperature with high-temperature solders. The zinc-rich tin/zinc/silver composition has a feature that the silver/zinc compound is produced by incorporation of silver, which concentrates the metallographic structure to increase the mechanical strength. However, if the amount of silver exceeds, the wetting property is lowered at the regular soldering temperature and the joining strength at the joint will be declined. Accordingly, the amount of silver is held so that the ratio of silver to tin/zinc may not exceed 15/85. and preferably not exceed 10/90.

When the solder containing zinc is oxidized, its melting temperature sharply rises up, thus decreasing the wetting property and the physical strength. It is hence desirable to carry out the preparation of the solder, namely the melting and mixing process under a non-oxidizing atmosphere, e.g. of nitrogen gas for allowing no oxidization so that the content of oxygen in the solder is not higher than 100 ppm (by weight). For minimizing the content of oxygen in the material such as tin, zinc or silver, a technique is proposed of treating the material with a deoxidizing agent such as phosphor or magnesium, which is low in the melting point and highly reactive with oxygen. This allows the deoxidizing agent to react with oxygen in the material to develop and float as a slug on the surface of a melted form of the material, which can thus be removed with ease. The amount of deoxidizing agent is equal to preferably 0.01 to 0.1% by weight of the material. As the result of using the deoxidizing agent in that manner, it can be prepared a solid solder which contains not higher than 30 ppm of oxygen.

The prepared solid solder may be formed into a wire solder or a powdered solder by a known manner as necessity arises. A solder paste can be prepared by mixing the powdered solder with a flux. The flux may be selected from various combinations of substances, depending on the chemical and mechanical requirements of the solder to be efficiently achieved.

The solder prepared in the above described manner, particularly the second type of solder material allows the soldering to be carried out favorably without using any flux over the member to be soldered. Particularly, it is easy when the amount of oxygen with formation of an oxide film on the surface of the raw material is low, and it is most effective when using the solder of the second type which the amount of blended silver is low. This effect may be explained by the action of zinc that zinc in the solder reacts at the joint interface with oxygen existing on the surface of the member to be bonded while the solder is being melted at a high temperature thus, to activate the surface of the member. The method of soldering may be selected from: heating and melting the solid solder placed on the surface of the member to be soldered; dipping the member to be soldered into the molten solder in accordance with the dipping manner, etc. When the surface of the member to be soldered is coated with a hardly oxidized material such as gold, the tin/zinc/silver composition can be directly used as the solder. When the member to be soldered is made of a material which is highly susceptible to oxidization, such as copper, its oxygen content may be reduced prior to the soldering action by chemical reduction process with a reducing gas selected from hydrogen, ammonium, alcohol vapor such as methanol gas, ethanol gas or propanol gas, and acid vapor such as formic acid or acetic acid. It is also possible to use oscillation energy such as ultrasonic waves that may activate the surface of the member to be soldered. The soldering is carried out in a non-oxidizing atmosphere, e.g. of nitrogen gas, argon gas, or in a low-oxygen atmosphere which contains not higher than 1000 ppm of oxygen.

The soldering with use of a solder paste as described above is carried out by a reflow technique of applying the solder by screen printing and coupling the members to be soldered in face-to-face relationship. The reflow technique is possibly carried out in the open-air atmosphere and preferably in a non-oxidizing atmosphere.

The solder paste is possibly improved in the storage stability by mixing the solder with a small amount of solid additive of which the vapor pressure is higher than that of zinc, and the additive is preferably selected from beryllium, magnesium, calcium, strontium, barium, manganese, gallium, indium, thallium, phosphor, antimony, bismuth, sulfur, serene, tellurium and polonium. The content of the additive is equal to not higher than 3% by weight of the solder and preferably not higher than 0.5% by weight. The tin/zinc/silver solder may also be protected from deterioration with time by blending another component such as scandium, yttrium, lanthanum, titanium, zirconium, chrome, iron, cobalt, nickel, copper, silver, boron, aluminum and silicon at an amount which is not higher than 1% by weight, and preferably not higher than 0.5% by weight, of total amount of solder material.

(2) Sn/Zn Solder

A tin/zinc solder material in which the ratio of tin to zinc is from 80/20 to 70/30 by weight has a linear extension coefficient that is smaller than those of simple tin, simple zinc and the current lead-containing solder (95Pb/3.5Sn/1.5Ag) and is close to that of copper ($1.62 \times 10^{-5}$ [/K]). Therefore, if the tin/zinc solder of this type is used for a device or an apparatus which has a copper-made member to be soldered, the thermal stress produced at repetition of raising and failing the temperature is reduced, and clacking to occur is also reduced. Since copper is generally used for substrate electrodes, lead of parts of semiconductor devices, this tin-zinc solder material is particularly useful as a bonding material for devices and apparatuses having a power semiconductor element. It is also useful for bonding members which are made of other metal than copper, whose linear extension coefficient is small, such as iron, nickel and the like.

In assembling and installing electronic parts for which miniaturization has been remarkably proceeded in recent years, it is important to decrease the distortion by thermal stress, and it is therefore effective for imparting thermal durability to the manufactured electronic products, to select a solder material whose linear extension coefficient is in an appropriate range. For soldering members made of copper, it is preferred that the linear extension coefficient of the solder material is within a range of one to about 1.4 times of that of copper, namely $2.25 \times 10^{-5}$ [/K]. The tin/zinc solder material in which the ratio of tin to zinc is 80:20 to 70:30 satisfies the above requirement. The linear extension coefficient of the tin/zinc solder material is closest at the ratio of 75/25 by weight to that of copper.

The Sn/Zn solder is prepared by heating and mixing the relevant materials of melted form. Its melting method is not limited but may preferably be carried out using an electric furnace or an are facility in which the atmosphere is controllable. For preventing the oxidization of melted metals, the non-oxidizing atmosphere may preferably be implemented with inert gas such as nitrogen or argon at a purity of 99.9% or more. It is also desirable to reduce the pressure to a vacuum of not higher than $5 \times 10^{-5}$ Pa or preferably not higher than $1 \times 10^{-5}$ Pa before establishing the non-oxidizing atmosphere. If desired, the deoxidization on the raw materials or the solder may be conducted using the above-described deoxidizing agent listed for the Sn/Zn/Ag solder.

The prepared solder may be converted to a wire solder or a powdered solder by a known processing manner as necessity arises. The powdered solder is possibly mixed with an appropriate flux to prepare a solder paste. The flux may be selected from various combination of substances so as to satisfy the chemical and mechanical requirements for the solder paste.

The solder paste is possibly improved in the storage stability by mixing the solder with a small amount or solid additive of which the vapor pressure is higher than that of zinc, and the additive is preferably selected from beryllium, magnesium, calcium, strontium, barium, manganese, gallium, indium, thallium, phosphor, antimony, bismuth, sulfur, serene, tellurium and polonium. The content of the additive is equal to not higher than 1% by weight of the solder and preferably not higher than 0.5% by weight. The tin/zinc solder may also be protected from deterioration with time by blending another component such as scandium, yttrium, lanthanum, titanium, zirconium, chrome, iron, cobalt, nickel, copper, silver, boron, aluminum and silicon at an amount which is not higher than 1% by weight, and preferably not higher than 0.5% by weight, of total amount of solder material.

The technique of soldering may involve heating and melting the solder placed on the member or dipping the member to be soldered into the melted solder. When the member to be soldered is highly susceptible to the oxidization, its content of oxygen may be reduced by the action of a reducing gas or ultrasonic waves. The soldering may also be carried out under the open-air atmosphere, preferably a non-oxidizing atmosphere of nitrogen gas, argon gas and the like, or a low-oxygen atmosphere which contains not higher than 1000 ppm of oxygen.

The soldering with the solder paste is possibly conducted by a known manner of screen printing and reflowing the paste for soldering. The reflow process may be carried out in the open-air atmosphere, and preferably in a non-oxidizing atmosphere.

(3) Sn/(Ge and/or Sn)/Al Solder

This solder is a tin-based alloy which contains at least one of germanium and aluminum, and its composition ratio is expressed by weight percentage as the formula: $(Ge,Al)/Sn = X/(100-X)$, where X is a numeral within a range from 0.01% to 2% by weight). Melting and mixing germanium and/or aluminum with tin at the above ratio in a non-oxidizing atmosphere prepare the alloy while its content of inevitable impurities pertinent to the mother materials is permitted.

The effect of germanium or aluminum added in the tin base is apparent when its content is not lower than 0.01% by weight of the total amount of (Ge,Al) and tin. With 0.01. to 2% by weight addition, the solidus temperature of the solder is about 230° C. (231° C. with germanium and 228° C. with aluminum) can be obtained. A combination of germanium and aluminum may also be used with equal success. In this case, it is prepared so that the total amount of the germanium content and the aluminum content is from 0.01 to 2% by weight and preferably from 0.05 to 2% by weight. When considering for prevention of the solidus temperature from falling down to an unpreferable level, it is desired to use solely germanium or aluminum. When the total amount of germanium and aluminum exceeds 2% by weight, the solidus temperature falls down to below 225° C., thus making the solder unfavorable for use as the high-temperature solder and highly susceptible to the oxidization. The aluminum contained tin alloy exhibits a higher level of the wetting property with a member made of aluminum to be soldered, thus ensuring a result of rigid soldering.

The Sn/(Ge and/or Al) solder is prepared by heating and mixing the relevant materials of melted form. Its melting method is not limited but may preferably be carried out using an electric furnace or an arc facility in which the atmosphere is controllable. For preventing the oxidization of melted metals, the non-oxidizing atmosphere may preferably be implemented with inert gas such as nitrogen dr argon at a purity of 99.9% or more. It is also desirable to reduce time pressure to a vacuum of not higher than $5 \times 10^{-3}$ Pa or preferably not higher than $1 \times 10^{-5}$ Pa before establishing the non-oxidizing atmosphere. If desired, the deoxidization on the raw materials or the solder may be conducted using the above-described deoxidizing agent listed for the Sn/Zn/Ag solder.

The prepared solder may be converted to a wire solder or a powdered solder by a known processing manner as necessity arises. The powdered solder is possibly mixed with an appropriate flux to prepare a solder paste. The flux way be selected from various combination of substances so as to satisfy the chemical and mechanical requirements for the solder paste.

The technique of soldering may involve heating and melting the solder placed on the member or dipping the member to be soldered into the melted solder. When the member to be soldered is highly susceptible to the oxidization, its content of oxygen may be reduced by the action of a reducing gas or ultrasonic waves. The soldering may also be tarried out under the open-air atmosphere, preferably a non-oxidizing atmosphere of nitrogen gas, argon gas and the like, or a low-oxygen atmosphere which contains not higher than 1000 ppm of oxygen.

The soldering with the solder paste is possibly conducted by a known manner of screen printing and reflowing the paste for soldering. The reflow process may be carried out in the open-air atmosphere, and preferably in a non-oxidizing atmosphere.

(4) Usage of the Solder

The solder of the present invention is a lead-less, highly flexible material and can equally be used in the assembling and soldering stage of a common system and facility designed for conventional high-temperature solders. Therefore, the solder of the present invention is possibly used as a substitute material of the conventional high-temperature solders and is a material suitable for forming joints or coatings in electric equipments accompanied with thermal elevation, power semiconductor devices for controlling voltage or current and apparatuses using the same. As examples of the electric equipments given are various lamps, electron tubes and their external connection electrodes, rectifiers, variable capacitors and the like. The power semiconductor device has a power semiconductor element such as transistors, diodes, thyristors, GTO thyristors, MOSFETs and the like and is constructed in the form of a power IC, a power module such as power trangister module, and the like. The solder of the present invention is favorably used for forming a direct or indirect bond in those devices or apparatuses incorporated with those devices. The member to be soldered is not limited to simple metals including copper, silver, gold, nickel, aluminum and SUS stainless steel but may be selected from various alloys and composite metals. Moreover, the solder of the present invention is equally applicable to any type of precision soldering, i.e. soldering an array of metallic wires spaced by a narrow distance. The member to be soldered may be covered with a pre-coating of a metal material by plating or press bonding before the soldering process, and the method of pre-coating and the composition of a pre-coating may arbitrarily be determined depending on the application.

Figure 1B:
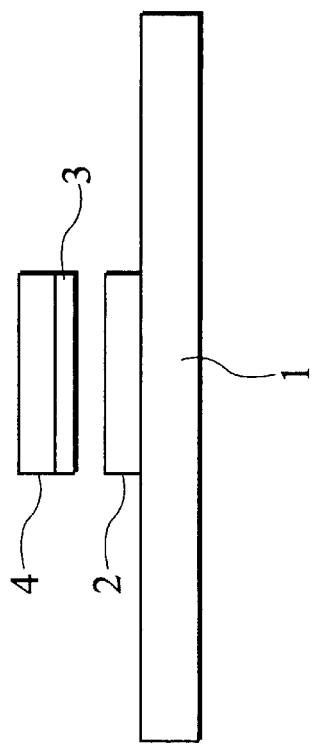
Figure 2:
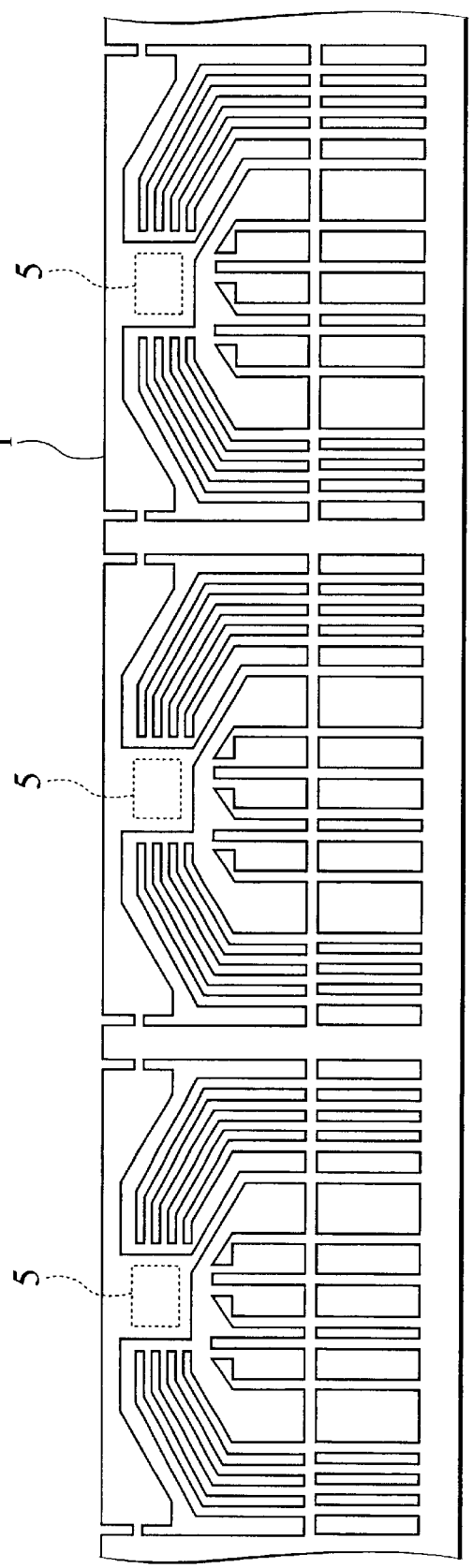
FIG. 2 is a plan view showing an example of a component on which the soldering is made with the solder material of the present invention.

FIGS. 1A and 1B are cross sectional views showing an example of soldering an electronic component to join with a lead frame with the solder according to the present invention. As shown in these drawings, the reference numeral 1 shows a lead frame made of copper, and FIG. 2 is a plan view thereof. The numeral 2 is the solder applied to a soldering portion of the lead frame 2. The numeral 3 is a plating layer provided on the backside of the semiconductor device 4 provided with an integrated circuit, for promoting the wetting property of the solder 2. The plating layer 3 may be deposited using a known plating method, a known plating material and a desired thickness selected depending on the application. For example, the plating material may be gold or silver plating. The plating may also be applied to the soldering portion of the lead frame 1.

The soldering between the lead frame 1 and the semiconductor device 4 may be conducted by the following procedure. In this embodiment, the solder 2 is a 13.6Ag/3Zn/Sn solder while the plating layer 3 is made of gold with a 1 μm thickness.

The procedure starts with transporting the lead frame 1 into a soldering apparatus filled with a nitrogen gas for establishing the non-oxidizing atmosphere and heating it to 350° C. for 60 seconds, and the solder 2 is applied for a few seconds to the center of the portion 5 to be soldered of the lead frame 1. A dose of the solder 2 is melted and wets the lead frame 1. After the solder 2 is released from the lead frame 1, the semiconductor device 4 is placed on the solder 2, where the state is shifted, as shown in the drawings, from FIG. 1A to FIG. 1B. While the semiconductor device 4 is positioned on the lead frame 1 with its lower side directly joined to the solder 2, it is heated to 360° C. and then cooled down. As a result, the cooled or solidified solder 2 joins the semiconductor device 4 to the lead frame 2. In this example, most of gold of the plating layer 3 is diffused throughout the solder 2. The semiconductor device 4 joined with the lead frame 2 is then subjected to further procedure including wire bonding, mold processing, etc., and the device obtained may be installed onto a printed circuit substrate with a low-temperature solder.

Figure 3A:
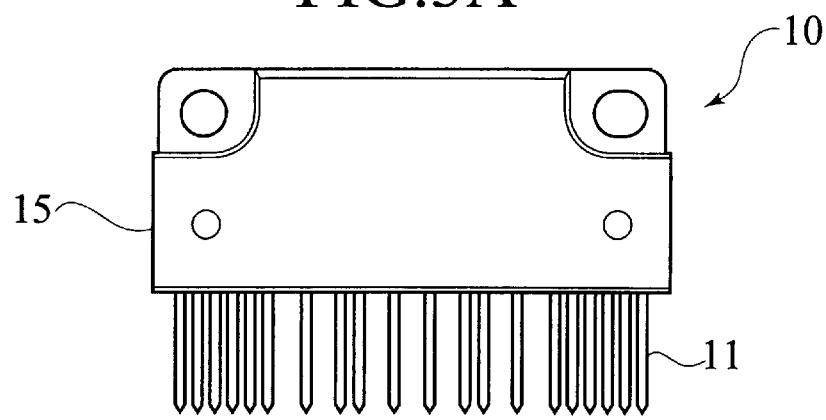
FIGS. 3A, 3B and 3C are a plane view, a side view and a cross sectional view of an example of a power semiconductor device using the solder material according to the present invention.
Figure 3B:
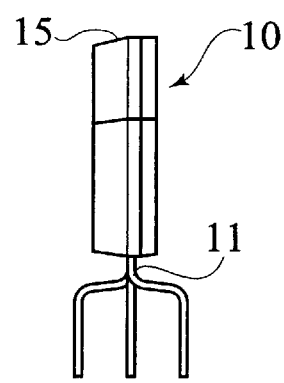
Figure 3C:
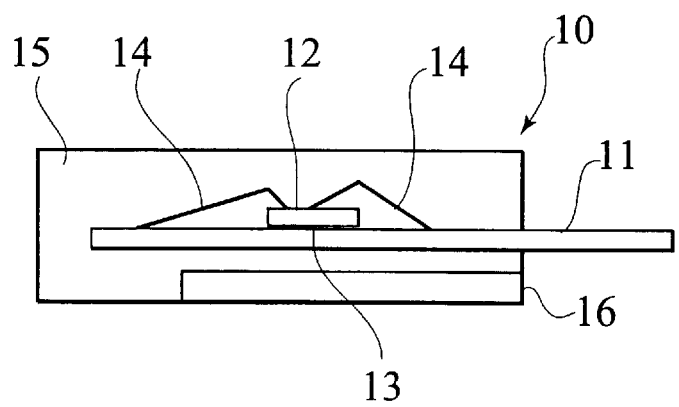

FIGS. 3A, 3B and 3C show an one-tip inverter IC for driving a stepper motor in office automation equipments, as an example of a power semiconductor device assembled in the similar process as described above, wherein FIG. 3A is a plane view, FIG. 3B is a side view and FIG. 3C is a sectional view. The IC 10 has a semiconductor element 12 having SOI structure which is bonded onto a lead frame 11 with the high-temperature solder material 13 described above. The semiconductor element 12 is electrically connected with the leaf frame 12 by wire bonding using a gold wire 14. Using a thermoset resin 15, the wire 14 and the semiconductor 12 is molded and a heat sink 16 is fixed at the opposite side to the semiconductor element 12. The heat generated by operation of the semiconductor element 12 is discharged by the heat sink 16 through the thermoset resin 15. However, the bond of the solder material 13 in this thermal environment is comparatively durable to distortion or deformation due to thermal change and difficultly changes with breakdown.

Figure 4A:
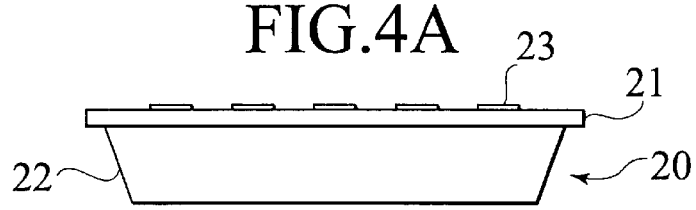
FIGS. 4A, 4B and 4C are side views for explanation of the assembling process of the power semiconductor apparatus using the solder material according to the present invention.
Figure 4B:
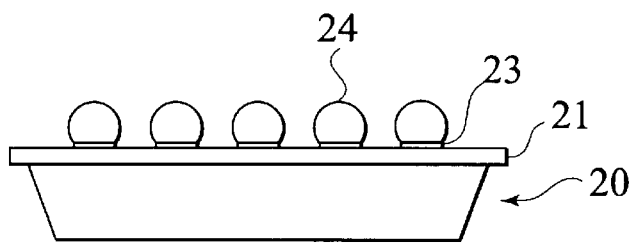
Figure 4C:
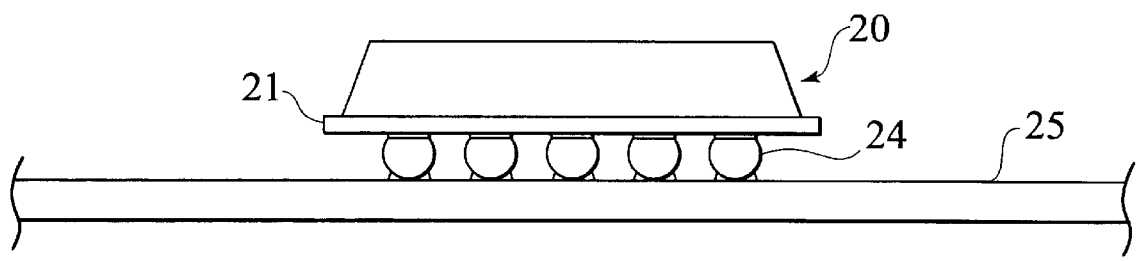

FIGS. 4A to 4C are view for explanation of an example of installation of a BGA type semiconductor package onto a printed circuit substrate, and FIG. 4A shows a semiconductor package 20 before solder balls are provided on it. The semiconductor package 20 comprises an LSI chip mounted on a substrate 21, wires for electrically connecting the LSI chip with the substrate, and mold resin 22 sealing the LSI chip and the wires. The substrate 21 of the semiconductor package has copper electrodes 23 at the opposite side to the LSI chip, as shown in FIG. 4A. A flux is applied to the surface of the electrodes 23 and solder valls 24 formed of the above-described high-temperature solder material, preferably a tin-zinc-silver solder material. The solder balls 24 are heated to melt at the surface thereof, and they are then cooled to bond the solder valls 24 to the electrodes 23, obtaining a BGA semiconductor package. In order to install the semiconductor package 20 to a printed circuit substrate 23, a paste of a low-temperature solder material such as tin-zinc eutectic solder is applied to electrodes to be joined on the printed circuit substrate 23, by the screen printing method or the like. The semiconductor package 20 is positioned on the printed circuit substate so that solder balls contact with the paste of lower-temperature solder. The soldering is then performed at a temperature that the low-temperature solder melts, thereby obtaining the semiconductor apparatus in which the semiconductor package is mounted on the printed circuit substrate. If a SOI element is used for the LSI chip of the semiconductor package 20, this semiconductor apparatus realizes a one-chip inverter used for refrigerators.

In use for power electronics devices as described above, it is preferred to select a high-temperature solder material which enables setting the soldering temperature to about 205 to 225° C. in view of thermal resistance of the substrate and other materials.

Figure 5:
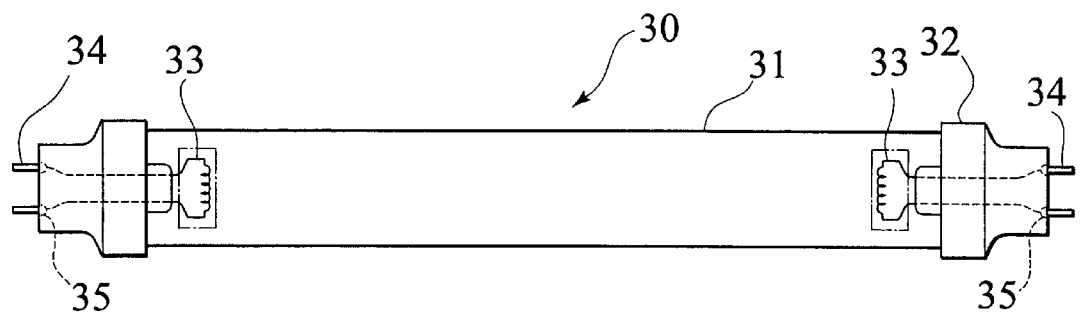
FIG. 5 is a side view showing an example of the electric equipment using the solder material according to the present invention.

The high-temperature solder material according to the present invention is also applicable for joint formation in electric equipments which are accompanied with generation or suffering of heat, for example, joint portion of electric lamps and the like. FIG. 5 shows a low pressure mercury lamp 30 as an example of them. The low pressure mercury lamp 30 has a quartz tube 31 in which mercury atoms and rare gas are enclosed, and a pair of base caps 32 into which the both terminals of the quartz tube 31 are fitted Each of a pair of filaments penetrates the quarts tube 31 form the inside to the outside kind is connected to the terminals 33 of the base cap 32 with the high-temperature solder material 35. Electric discharge and luminescence are caused between the filaments by the electric power applied to the terminals 33 through a stabilizer. In the use like this kind, it is general to use at high-temperature solder material which is capable to set the soldering temperature to about 220 to 380° C., preferably about 230 to 300° C. The joints of filaments of base caps in the case of incandescent electric lamps or revolving lights are similar to the above.

There is an evaluation method called a thermal cycle test (TCT) which evaluate the reliability of the soldering as described above, which is used for the bonding and assembling of the apparatus or device from its parts including semiconductor elements. This test involves repeating a cycle to heating and tooling to increase and decrease the temperature of the semiconductor devices throughout a certain period of time, and the measured subjects include changes in the physical values such as current and voltage representing discrepancies of the characteristics, the duration from the initial state to a defective state which exhibits a mechanical fault such as cracking resulting from thermal fatigue, and etc. From the measurement, the durability of the assembly, i.e. apparatus or device, can be estimated in a given service period of use with thermal changes. Therefore, the assembly built with the solder cart hence be evaluated from discrepancies of the characteristics measured by the TCT procedure.

As electronic apparatuses are advanced in the function, the number of electronic components constructing such apparatuses and their types in each component will increase and thus the number of soldering joints will increase. However, in some eases according to discrete arrangements or steps, the soldering has to be carried out two or more times. In such a case, during and after the second soldering, the other devices are exposed to heat more than one time. As a result, the solder solidified at the previous soldering step may melt down in the succeeding soldering step thus causing deformation or break at the soldered joint, since the use of the same solder requires the same heat at the succeeding step. Accordingly, when the soldering is carried out two or more times, two or more solders which are different in the melting point may be necessary corresponding to the soldering steps. In this case, a solder having a higher soldering temperature is used at the initial step of the soldering process and at the succeeding step, the solder is replaced by a solder having a lower soldering temperature for inhibiting the device once soldered from being detached or avoiding the deformation at the joint. The high-temperature solder is effective not only for assembling a component which requires a resistance to heat but also for use in multiple steps of manufacturing a component. A group of solders and their soldering temperature are hence determined in such a multi-step soldering process that a difference of the melting temperature (it must be strictly the solidus temperature, but if the liquidus temperature is pretty higher, it may also be a temperature at which substantial melting down is caused) between one solder used in the current step and another solder use in the succeeding step is not lower than about 5° C. and preferably not lower than about 15° C. For example, assuming that the soldering procedure includes two steps, the first solder incorporates a composition at Sn/Al=99.4/0.6 (of the weight ratio) and the second solder at Sn/Zn=91/9, while their soldering temperatures are declined about 15° C.

EXAMPLES

The present invention will now be explained with referring to specific examples.

Example 1

Preparation of Test Samples 1 to 14

In a preparation for each sample, a 99.98% purity of tin, a 99.99% purity of zinc and a 99.97% purity of silver at the weight ratio shown in Table 1 were placed into a melting bath with a nitrogen atmosphere which contains not higher than 100 ppm of oxygen. Then they were heated until they melted down and mixed with each other, before cooling to the room Temperature to have each of Test Samples 1 to 14 in a state of uniform solder. The solders were examined to measure their liquidus temperature at a temperature increasing speed of 10° C./min, using a differential scanning calorimeter (DSC). The results of measurements are shown in Table 1 (with an error of ±20° C. at maximum).

TABLE 1

| Test Sample | Composition (parts by weight) | | | Liquidus Temp. (° C.) |
|---|---|---|---|---|
| | Tin | Zinc | Silver | |
| 1 | 97 | 3 | 13.6 | 262 |
| 2 | 97 | 2 | 100 | 467 |
| 3 | 79 | 21 | 13.6 | 440 |
| 4 | 79 | 21 | 100 | 452 |
| 5 | 91 | 9 | 42.9 | 383 |
| 6 | 70 | 30 | 0 | 328 |
| 7 | 70 | 30 | 11 | 456 |
| 8 | 70 | 30 | 12.75 | 464 |
| 9 | 5 | 95 | 0 | 400 |

TABLE 1-continued

| Test Sample | Composition (parts by weight) | | | Liquidus Temp. (° C.) |
|---|---|---|---|---|
| | Tin | Zinc | Silver | |
| 10 | 5 | 95 | 11 | 480 |
| 11 | 5 | 95 | 12.75 | 506 |
| 12 | 40 | 60 | 0 | 370 |
| 13 | 40 | 60 | 11 | 473 |
| 14 | 60 | — | 40 | 440 |

Estimation of Test Samples

For each of Test Samples 1 to 14, the solder sample was placed in a melting bath with a nitrogen atmosphere and heated at 520° C. A copper plate of 5 mm×50 mm (having its surface rinsed with acid) was dipped in the melted solder for soldering. The copper sheets were observed for visually measuring the wetting property over the surface. The copper sheets of which the surface is covered higher than 98% with the solder are classified as A, from 95 to 98% as B, and lower than 95% as C, for estimation. The result is shown in Table 2.

TABLE 2

| Test Sample | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| Estimation | A | A | A | C | B | A | A | B | A | A | B | A | A | C |

A lead frame 1 as shown in FIG. 2 was transported into a soldering apparatus with a nitrogen atmosphere and heated on a heating plate of 350° C. for 60 seconds. The lead frame 1 was contacted with a solder wire having 0.5 mm diameter and being made of each of test samples 1 to 13 for two seconds at the portion 5 to be joined to a semiconductor device. The semiconductor device 4 was joined directly to the molten solder 2 left on the lead frame 1 while the remaining solder wire was released, and heated by the heating plate of 360° C. for two seconds. The lead frame 1 with the semiconductor device 4 were then cooled down to the room temperature. As a result, the lead frame 1 and the semiconductor device 4 were soldered with each other.

The semiconductor 4 and the lead frame 1 were bonded using a gold wire and molded with epoxy resin.

For estimation of the bonding properties of the solder, a thermal cycle test was conducted by repeating a cycle of heating up and cooling down in the following conditions. Here, it is noted that, before starting the test, a constant voltage was applied to the device and measured the current flowing it.

Temperature Range: −65° C. to 150° C.

Holding Time: 30 minutes at each of −65° C. and 150° C.

Repeating Cycle: 500 cycles and 1000 cycles

In the thermal cycle test, the forward current passing the device was measured after 500 cycles and 1000 cycles of the heating and cooling, respectively. The solders are classified as A when the current increase from the initial level was within 5% after 500 cycles and was within 15% after 1000 cycles, B when being within 5% after 500 cycles and within 20% after 2000 cycles, and C when any other measurements. The results are shown in Table 3.

TABLE 3

| Test Samples | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| Estimation | A | B | A | C | B | A | A | B | A | B | B | A | A | C |

Example 2

Preparation of Test Samples 15 to 20

For a preparation of Test Sample 15, 99.99% pure shots of tin and germanium were weighed at a ratio of Ge/Sn=0.35/99.85 using an electronic balance, placed in a crucible made of high-purity alumina (SSA-S according to JIS), and transported into an electric furnace. After the electric furnace was evacuated to a vacuum of $2\times10^{-3}$ Pa, its atmosphere was filled with 99.99% pure argon introduced at a flow rate of 1 L/min. The crucible in the electric furnace was then heated at 350° C. for ten minutes to melt and mix the content. After the molten mixture was cooled down to the room temperature, a Ge/Sn alloy was produced as a solder of Test Sample 15. Similarly, germanium, tin and aluminum were weighed at the ratio shown in Table 4, placed and heated in a crucible, and cooled down to the room temperature to have uniform solders of Test Samples 16 to 20.

A portion of the solder of Test Sample 15 was crushed and measured in accordance with the X-ray diffraction method. As a result, a $\beta$-$Sn_3$ phase was observed. Then the cross section was observed by the SEM method and found that a germanium-rich phase was separated in the form of the needles. Moreover, the alloy composition was measured in accordance with the ICP emission spectroscopic analysis and found that its ratio was identical to the initial mixing ratio for the preparation.

Evaluation of Test Samples a. Solidus Temperature

The solidus temperature of the Ge/Sn alloy solder of Test Sample 15 was measured at a temperature increasing speed of 10° C./min. using a differential scanning calorimeter (DSC) and found 231° C. Similarly, those of Test Samples 16 to 20 also were measured. The results are shown in Table 4.

b. Wetting Property

The Ge/Sn alloy solder of Test Sample 15 was heated and melted at 250° C. in the open-air atmosphere. A flux (25% rosin and 75% isopropyl alcohol) conforming to JIS C0050 Appendix standard C was provided on the melted alloy. A copper sheet of 8 mm long×4 mm wide×0.25 mm thick was dipped at a speed of 2 mm/sec to a depth of 5 mm in the melted alloy and held for three seconds. The ratio of the area of the copper sheet coated with a layer of the alloy to the entire dipped area was then calculated for determining the wetting property. As a result, the coated ratio was 80%. Similarly, the solders of Test Samples 16 to 20 were examined for the ratio of the coated area to the entire dipped area. The results are shown in Table 4.

c. Resistance to Heat

A lead frame 1 as shown in FIG. 2 was placed in a soldering apparatus with a nitrogen atmosphere and heated on a heating plate of 290° C. for sixty seconds. The lead frame 1 was then contacted with a 0.5 mm diameter wire made of the solder of each of Test Samples 15 to 20 for two seconds at its soldering portion to be joined to a semiconductor device. The semiconductor device 4 was joined directly to the molten solder 2 left on the lead frame 1 while the remaining solder wire was removed, and heated by the heating plate of 300° C. for 2 seconds. The lead frame 1 with the semiconductor device 4 were then cooled down to the room temperature. As a result, the lead frame 1 and the semiconductor device 4 were soldered with each other.

For estimation of the solder bonding, the physical strength of each test sample at the joint was examined before and after the thermal cycle test under the following conditions.

Temperature Range: −40° C. to 150° C.

Holding Time: 30 minutes at −40° C. and 150° C.

Repeating Cycle: 1000 cycles

It was found that the physical strength of the solder bonding of Test Sample 15 before and after the thermal cycle test exhibited no sign of declination. Similarly, the solders of Test Samples 16 to 20 were examined for the physical strength before and after the thermal cycle test. The results are shown in Table 4.

TABLE 4

| Test Sample | Composition (% by weight) | | | Liquidus Temp. (° C.) | Wetting Performance (%) | Strength Declining |
|---|---|---|---|---|---|---|
| | Sn | Ge | Al | | | |
| 15 | 99.85 | 0.15 | — | 231 | 80 | No |
| 16 | 99.9 | 0.1 | — | 231 | 95 | No |
| 17 | 99.4 | — | 0.6 | 228 | 93 | No |
| 18 | 99.0 | 0.5 | 0.5 | 225 | 94 | No |
| 19 | 97.0 | — | 3.0 | 228 | 60 | Yes |
| 20 | 96.0 | 2.0 | 2.0 | 220 | 63 | Yes |

Example 3

Preparation of Test Samples 21 to 25

In a preparation for each sample, a 99.98% purity of tin and a 99.99% purity of zinc at the weight ratio shown in Table 5 were placed into a melting bath with a nitrogen atmosphere which contains not nigher than 100 ppm of oxygen. Then they were heated until they melted down and mixed with each other, before cooling to the room temperature to have each of Test Samples 21 to 25 in a state of uniform solder. The solders were examined to measure their liquidus temperature at a temperature increasing speed of 10° C./min, using a differential scanning calorimeter (DSC). The results of measurements are shown in Table 1 (with an error of ±20° C. at maximum).

TABLE 5

| Test Sample | Composition (parts by weight) | | Liquidus Temp (° C.) | Linear Extension Co. [/K] |
|---|---|---|---|---|
| | Tin | Zinc | | |
| 21 | 100 | 0 | 232 | $2.35 \times 10^{-5}$ |
| 22 | 80 | 20 | 285 | $2.24 \times 10^{5}$ |
| 23 | 75 | 25 | 313 | $2.17 \times 10^{-5}$ |
| 24 | 70 | 30 | 327 | $2.23 \times 10^{-5}$ |
| 25 | 0 | 100 | 419 | $3.10 \times 10^{-5}$ |

Estimation of Test Samples

For each of Test Samples 21 to 25, the solder sample was placed in a melting bath with a nitrogen atmosphere and heated at 520° C. A copper plate of 5 mm×50 mm (having its surface rinsed with acid) was dipped in the melted solder for soldering. The copper sheets were observed for visually measuring the wetting property over the surface. The copper sheets of which the surface is covered higher than 98% with the solder are classified as A, from 95 to 98% as B, and lower than 95% as C, for estimation. The result is shown in Table 6.

TABLE 6

| Test Sample | 21 | 22 | 23 | 24 | 25 |
|---|---|---|---|---|---|
| Estimation | A | A | A | A | C |

A lead frame 1 as shown in FIG. 2 was transported into a soldering apparatus with a nitrogen atmosphere and heated on a heating plate of 350° C. for 60 seconds. The lead frame 1 was contacted with a solder wire having 0.5 mm diameter and being made of each of test samples 21 to 25 for two seconds at the portion 5 to be joined to a semiconductor device. The semiconductor device 4 was joined directly to the molten solder 2 left on the lead frame 1 while the remaining solder wire was released, and heated by the heating plate of 360° C. for two seconds. The lead frame 1 with the semiconductor device 4 were then cooled down to the room temperature. As a result, the lead frame 1 and the semiconductor device 4 were soldered with each other.

The semiconductor 4 and the lead frame 1 were bonded using a gold wire and molded with epoxy resin.

For estimation of the bonding properties of the solder, a thermal cycle test was conducted by repeating a cycle of heating up and cooling down in the following conditions. Here, it is noted that, before starting the test, a constant voltage was applied to the device and measured the current flowing it.

Temperature Range: −65° C. to 150° C.

Holding Time: 30 minutes at each of −65° C. and 150° C.

Repeating Cycle: 500 cycles and 1000 cycles

In the thermal cycle test, the forward current passing the device was measured after 500 cycles and 1000 cycles of the heating and cooling, respectively. The solders are classified as A when the current increase from the initial level was within 5% after 500 cycles and was within 15% after 1000 cycles, B when being within 5% after 500 cycles and within 20% after 1000 cycles, and C when any other measurements. The results are shown in Table 7.

TABLE 7

| Test Samples | 21 | 22 | 23 | 24 | 25 |
|---|---|---|---|---|---|
| Estimation | C | B | A | B | C |

When the solder materials which have a low electrical resistance as described above is used to form a electric connection in electronic devices, it is possible to reduce the neat generation at the solder connection during the operation of the devices. This is advantageous in that the heat resistance required for the materials constructing the device may be decreased lower than the conventional cases.

According to the present invention, the lead-less high-temperature solder suited for soldering at a range of higher temperatures is prepared from a commonly available materials at a low price and with ease. As the present invention is highly effective for implementing lead-less solders, it can successfully eliminate the conventional drawback of lead contained in industrial wastes hence contributing to both the industrial development and the environmental protection.

It must be understood that the invention is in no way limited to the above embodiments and that many changes may be brought about therein without departing from the scope of the invention as defined by the appended claims.

What is claimed is:

1. An electric or electronic device comprising parts which are joined with a solder material, the solder material comprising: tin, zinc and silver, wherein the ratio of tin to zinc is within a range of 97/3 to 87/13 by weight, and the ratio of the sum of tin and zinc to silver is within a range of 88/12 to 50/50 by weight.

2. The electric or electronic device of claim 1 which comprises a power semiconductor element which is selected from the group consisting of transistor, a thyristors, a GTO thyristor, diode and MOSFET.

3. The electric or electronic device of claim 1 which includes a power element which is selected from the group consisting of an electron tube, an external connection electrodes for an electron tube, a rectifier, a capacitor and a lamp.

4. An electric or electronic device comprising parts which are joined with a solder material, the solder material consisting essentially of 0.01 to 2% by weight of aluminum, and the balance tin.

5. The electric or electronic device of claim 4 which comprises a power semiconductor element which is selected from the group consisting of transistor, a thyristor, a GTO thyristor, diode and MOSFET.

6. The electric or electronic device of claim 4 which includes a power element which is selected from the group consisting of art electron tube, an external connection electrodes for an electron tube, a rectifier, a capacitor and a lamp.

7. An electric or electronic device comprising parts which are joined with a solder material, the solder material consisting essentially of: tin and zinc, wherein the ratio of tin to zinc is within a range of 80/20 to 70/30 by weight.

8. A process for manufacturing an electric or electronic device, comprising: soldering with a first solder material at a first temperature; and soldering later than soldering with the first solder material, with a second solder material at a second temperature which is lower than the first temperature, wherein the first solder material comprises one of a solder (A), a solder (B) and a solder (C), the solder (A) comprising tin, zinc and silver, wherein the ratio of tin to zinc is within a range of 97/3 to 87/13 by weight, and the ratio of the sum of tin and zinc to silver is within a range of 88/12 to 50/50 by weight, the solder (B) comprising tin, and zinc wherein the ratio of tin to zinc is within a range of 80/20 to 70/30 by weight, and the solder (C) consisting essentially of 0.01 to 2% by weight of aluminum, and the balance tin.

9. The manufacturing process of claim 8, wherein the second solder material comprises a tin-zinc eutectic composition.

10. The manufacturing process of claim 8, wherein the second temperature is lower at least approximately 5° C. than the first temperature.

11. The manufacturing process of claim 8, wherein the second temperature is lower at least approximately 15° C. than the first temperature.

* * * * *